United States Patent
Xiao et al.

(10) Patent No.: US 10,013,942 B2
(45) Date of Patent: Jul. 3, 2018

(54) GOA CIRCUIT, DRIVING METHOD THEREOF AND LIDUID CRYSTAL DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Ronglei Dai, Guangdong (CN); Shangcao Cao, Guangdong (CN); Yao Yan, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 228 days.

(21) Appl. No.: 14/900,684

(22) PCT Filed: Oct. 21, 2015

(86) PCT No.: PCT/CN2015/092419
§ 371 (c)(1),
(2) Date: Dec. 22, 2015

(87) PCT Pub. No.: WO2017/049688
PCT Pub. Date: Mar. 30, 2017

(65) Prior Publication Data
US 2017/0193944 A1   Jul. 6, 2017

(30) Foreign Application Priority Data
Sep. 23, 2015 (CN) .......................... 2015 1 0613413

(51) Int. Cl.
*G09G 3/36* (2006.01)
*G02F 1/1368* (2006.01)
*G02F 1/1362* (2006.01)

(52) U.S. Cl.
CPC ......... *G09G 3/3677* (2013.01); *G02F 1/1368* (2013.01); *G02F 1/136286* (2013.01);
(Continued)

(58) Field of Classification Search
CPC ............. G02F 1/136286; G02F 1/1368; G02F 2203/64; G09G 2300/0408;
(Continued)

(56) References Cited

U.S. PATENT DOCUMENTS 8,836,684 B2   9/2014   Harada
9,383,841 B2   6/2016   Lin
(Continued)

FOREIGN PATENT DOCUMENTS

| CN | 104392705 A | 6/2016 |
| CN | 105118464 A | 3/2017 |
| KR | 1020140071056 A | 6/2014 |

Primary Examiner — Dmitry Bolotin
(74) Attorney, Agent, or Firm — Andrew C. Cheng

(57) ABSTRACT

The disclosure provides a GOA circuit, a driving method thereof and a liquid crystal display device. The GOA circuit comprises a plurality of GOA units connected in cascade, wherein the N-stage GOA unit comprises a N-stage stage circuit, a N-stage Q point control circuit, a N-stage P point circuit, a N-stage output circuit and a switch circuit. The switch circuit is connected to the N-stage scan line for sending a turn-on signal to the N-stage scan line before the liquid crystal display device displays an image such that the thin-film transistor in the pixel connected to the N-stage scan line turns on. The disclosure may turn on the gate of each pixel when the display device is waken from the black screen to prevent the electricity leakage when the display (Continued)

device is wakened from the black screen, and may also increase the stability of the circuit.

17 Claims, 4 Drawing Sheets

(52) U.S. Cl.
CPC . *G02F 2203/64* (2013.01); *G09G 2300/0408* (2013.01); *G09G 2310/08* (2013.01); *G09G 2320/0214* (2013.01); *G09G 2330/026* (2013.01)

(58) Field of Classification Search
CPC ....... G09G 2310/08; G09G 2320/0214; G09G 2330/026; G09G 3/3677
See application file for complete search history.

(56) References Cited

U.S. PATENT DOCUMENTS

| | | | |
|---|---|---|---|
| 2013/0063404 A1 | 3/2013 | Jamshidi Roudbari | |
| 2014/0146026 A1 | 5/2014 | Yu | |
| 2015/0294636 A1* | 10/2015 | Yu | G09G 3/3655 345/204 |
| 2016/0005372 A1* | 1/2016 | Yu | G09G 3/3677 345/208 |
| 2016/0188074 A1 | 6/2016 | Xiao | |
| 2016/0189584 A1 | 6/2016 | Xiao | |
| 2016/0189586 A1* | 6/2016 | Zou | G09G 3/3266 345/213 |
| 2016/0189649 A1* | 6/2016 | Xiao | G11C 19/28 345/214 |
| 2016/0343333 A1 | 11/2016 | Yu | |
| 2017/0018245 A1* | 1/2017 | Park | G09G 3/3688 |
| 2017/0169784 A1* | 6/2017 | Xiao | G09G 3/3677 |

* cited by examiner

GOA CIRCUIT, DRIVING METHOD THEREOF AND LIDUID CRYSTAL DISPLAY DEVICE

BACKGROUND

Technical Field

The disclosure is related to the field of the display technology, and more particular to a GOA circuit, a driving method thereof and a liquid crystal display device.

Related Art

The GOA (Gate Driver On Array or Gate On Array) circuit is a technology using the existing TFT-LCD array process to manufacture the gate scan driving signal circuit on the array substrate to achieve the driving method to progressively scan the gate line. Compared with the transitional COF and COG process, it not only saves the cost but also reduce the gate direction bonding process. It is extremely beneficial to improve productivity and increase the integrity of the display device.

During actual use, because the display device is usually configured with a touch panel, the GOA circuit needs to stop signals to match the function of the touch panel, such as the scan on the touch panel. Under general conditions, after the GOA circuit achieves stopping signals, it requires to wake the display device from the black screen. AT this time the GOA circuit is necessary to turn on all the gate lines in a predetermined time, and remove the remaining voltage level in the pixel capacitors by way of imposing black voltage on the date line such that the display device may be better display effect. This period is referred as All Gate On stage. However in the current technology the GOA circuit may fail when performing the All Gate On function such that the stable function of All Gate on may not be achieved.

SUMMARY

The technical problem mainly solved by the present disclosure is to provide a GOA circuit and driving method thereof and a liquid crystal display device, which may turn on the gate of each pixel when the display device is waken from the black screen in order to input low voltage level signals to each pixel, and to prevent the electricity leakage when the display device is waken from the black screen, and to increase the circuit stability simultaneously.

In order to solve the above technical problem, one technical solution adopted by the present disclosure is to provide a GOA circuit, adapted for the liquid crystal display device, comprising: a plurality of GOA units connected in cascade, N being an positive integer, wherein the N-stage GOA unit comprises a N-stage stage circuit, a N-stage Q point control circuit, a N-stage P point circuit, a N-stage output circuit and a switch circuit; wherein the N-stage stage circuit, the N-stage Q point control circuit, the N-stage P point control circuit, and the N-stage output circuit are connect to the Q point; the N-stage Q point control circuit, the N-stage P point control circuit and the N-stage output circuit are connected to the P point; the N-stage output circuit is further connected to the N-stage scan line; wherein the switch circuit is connected to the N-stage scan line, for sending a turn-on signal to the N-stage scan line before the liquid crystal display device displays an image such that the thin-film transistor in the pixel connected to the N-stage scan line turns on.

In one embodiment of the GOA circuit, the switch circuit comprises a first thin film transistor, having a source connected to the N-stage scan line and a drain connected to a gate and input with a turn-on signal; before the liquid crystal display device displays the image, the turn-on signal is a low voltage level signal such that the low voltage level signal is input to the N-stage scan line, thereby turning on the thin film transistor in the pixel connected to the N-stage scan line.

In one embodiment of the GOA circuit, the N-stage stage circuit comprises a second thin film transistor, a third thin film transistor and a forth thin film transistor; wherein the gate of the second thin film transistor is input with the output signal of the (N−2)-stage GOA unit, and the drain is input with a positive scan signal; wherein the gate of the third thin film transistor is input with the output signal of the (N+2)-stage GOA unit, and the drain is input with a negative scan signal; wherein the gate of the forth thin film transistor is input with a first clock signal, the drain is connected to the source of the second thin film transistor and the third thin film transistor, and the source is connected to the Q point.

In one embodiment of the GOA circuit, the N-stage P point control circuit comprises a fifth thin film transistor and a sixth thin film transistor; wherein the gate of the fifth thin film transistor is connected to the Q point, the drain is connected to a first clock signal, and the source is connected to the P point; wherein the gate of the sixth thin film transistor is input with the first clock signal, the drain is input with a low voltage level signal, and the source is connected to the P point.

In one embodiment of the GOA circuit, the N-stage Q point control circuit comprises a seventh thin film transistor and a eighth thin film transistor; wherein the gate of the seventh thin film transistor is input with the second clock signal, the drain is connected to the Q-point; wherein the gate of the eighth thin film transistor is connected to the P point, the drain is connected to the source of the seventh thin film transistor, and the source is input with a high voltage level signal.

In one embodiment of the GOA circuit, the N-stage output circuit comprises a ninth thin film transistor and a tenth thin film transistor; wherein the gate of the ninth thin film transistor is connected to the Q point, the drain is input with a second clock signal, and the source is connected to the N-stage scan line; wherein the gate of the tenth thin film transistor is connected to the P point, the drain is connected to the N-stage scan line, and the source is input with a high voltage level signal.

In one embodiment of the GOA circuit, the N-stage scan driving circuit further comprises a P point pull-up circuit; wherein the P point pull-up circuit comprises an eleventh thin film transistor, having a gate input with a turn-on signal, a drain connected to the P point and a source input with a high voltage level signal.

In one embodiment of the GOA circuit, the N-stage scan driving circuit further comprises a resent circuit; wherein the reset circuit comprises a twelfth thin film transistor, having a gate and a source input with a reset signal, and a drain connected to the P point.

In order to solve the above technical problem, one technical solution adopted by the present disclosure is to provide a method for driving a GOA circuit, adopted for a GOA circuit comprising a plurality of GOA units connected in cascade, N being an positive integer, wherein the N-stage GOA unit comprises a switch circuit connected to the N-stage scan line, the method comprises: turning on the switch circuit of the GOA unit of each stage; inputting a turn-on signal to the scan line of each stage such that the thin film transistor in the pixel connected to the scan line of each stage turns on; and turning off the switch circuit of the GOA unit of each stage; starting scan from the first-stage GOA unit or the last-stage GOA unit.

In order to solve the above technical problem, one technical solution adopted by the present disclosure is to provide a liquid crystal display device comprising: a display panel and a backlight; wherein the display panel comprising a GOA circuit, the GOA circuit comprising a plurality of GOA units connected in cascade, N being an positive integer, wherein the N-stage GOA unit comprises a N-stage stage circuit, a N-stage Q point control circuit, a N-stage P point circuit, a N-stage output circuit and a switch circuit; wherein the N-stage stage circuit, the N-stage Q point control circuit, the N-stage P point control circuit, and the N-stage output circuit are connect to the Q point; the N-stage Q point control circuit, the N-stage P point control circuit and the N-stage output circuit are connected to the P point; the N-stage output circuit is further connected to the N-stage scan line; wherein the switch circuit is connected to the N-stage scan line, for sending a turn-on signal to the N-stage scan line before the liquid crystal display device displays an image such that the thin-film transistor in the pixel connected to the N-stage scan line turns on.

In one embodiment of the liquid crystal display device, the switch circuit comprises a first thin film transistor, having a source connected to the N-stage scan line and a drain connected to a gate and input with a turn-on signal; before the liquid crystal display device displays the image, the turn-on signal is a low voltage level signal such that the low voltage level signal is input to the N-stage scan line, thereby turning on the thin film transistor in the pixel connected to the N-stage scan line.

In one embodiment of the liquid crystal display device, the N-stage stage circuit comprises a second thin film transistor, a third thin film transistor and a forth thin film transistor; wherein the gate of the second thin film transistor is input with the output signal of the (N−2)-stage GOA unit, and the drain is input with a positive scan signal; wherein the gate of the third thin film transistor is input with the output signal of the (N+2)-stage GOA unit, and the drain is input with a negative scan signal; wherein the gate of the forth thin film transistor is input with a first clock signal, the drain is connected to the source of the second thin film transistor and the third thin film transistor, and the source is connected to the Q point.

In one embodiment of the liquid crystal display device, the N-stage P point control circuit comprises a fifth thin film transistor and a sixth thin film transistor; wherein the gate of the fifth thin film transistor is connected to the Q point, the drain is connected to a first clock signal, and the source is connected to the P point; wherein the gate of the sixth thin film transistor is input with the first clock signal, the drain is input with a low voltage level signal, and the source is connected to the P point.

In one embodiment of the liquid crystal display device, the N-stage Q point control circuit comprises a seventh thin film transistor and a eighth thin film transistor; wherein the gate of the seventh thin film transistor is input with the second clock signal, the drain is connected to the Q-point; wherein the gate of the eighth thin film transistor is connected to the P point, the drain is connected to the source of the seventh thin film transistor, and the source is input with a high voltage level signal.

In one embodiment of the liquid crystal display device, the N-stage output circuit comprises a ninth thin film transistor and a tenth thin film transistor; wherein the gate of the ninth thin film transistor is connected to the Q point, the drain is input with a second clock signal, and the source is connected to the N-stage scan line; wherein the gate of the tenth thin film transistor is connected to the P point, the drain is connected to the N-stage scan line, and the source is input with a high voltage level signal.

In one embodiment of the liquid crystal display device, the N-stage scan driving circuit further comprises a P point pull-up circuit; wherein the P point pull-up circuit comprises an eleventh thin film transistor, having a gate input with a turn-on signal, a drain connected to the P point and a source input with a high voltage level signal.

In one embodiment of the liquid crystal display device, the N-stage scan driving circuit further comprises a resent circuit; wherein the reset circuit comprises a twelfth thin film transistor, having a gate and a source input with a reset signal, and a drain connected to the P point.

The beneficial effects are that distinguishing from the prior art, a switch circuit is configured on the N-stage scan line G(N) of the GOA unit of each stage in the GOA circuit in the embodiment, for inputting a turn-on signal to the N-stage scan line G(N) of the GOA unit of each stage to turn on the TFT of each pixel before the display panel displays an image, i.e. waken from the black screen or the signal stops. And the low voltage level signal is input to each pixel to remove the remaining capacitance in the pixel capacitor to achieve All Gate On function. It may facilitate to prevent the electricity leakage when the display device is wakened from the black screen, and may also increase the stability of the circuit.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor. In drawings.

DETAILED DESCRIPTION

The disclosure will now be combined with the drawings and the embodiments to describe in details as follows.

Figure 1:
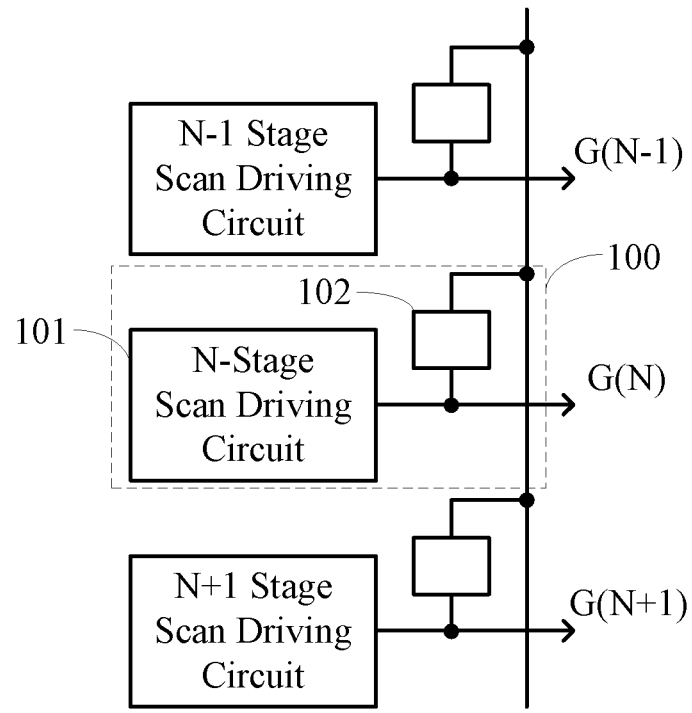
FIG. 1 illustrates the schematic circuit of the GOA circuit according to the first embodiment of the present disclosure.

Refer to FIG. 1, which illustrates the schematic circuit of the GOA circuit according to the first embodiment of the present disclosure. The GOA circuit comprises a plurality of GOA units connected in cascade. N is an positive integer.

The N-stage GOA unit 100 comprises a N-stage scan driving circuit 101 for driving the N-stage scan line G(N) in the display region. The N-stage GOA unit 100 further comprises a switch circuit 102. The switch circuit 102 is connected to the N-stage scan line G(N), for turning on in response to a turn-on signal before the liquid crystal display device displays an image, and inputting a low voltage level signal to the N-stage scan line G(N). It is appreciated that the N-stage GOA unit 100 comprising the switch circuit 102 indicates that the GOA unit of each stage comprises the switch circuit 102.

FIG. 1 merely illustrates three consecutive GOA units, which are exemplary, and it does not intend to limit the number of the GOA units in the embodiment. In the specific application, the gate (that is the N-stage scan line G(N)) of the GOA unit of each stage in the GOA circuit of the display pane is connected to the switch unit 102, for inputting a turn-on signal to the gate to turn on the gate of each pixel when the display panel is waken from the black or the signal stops.

Figure 2:
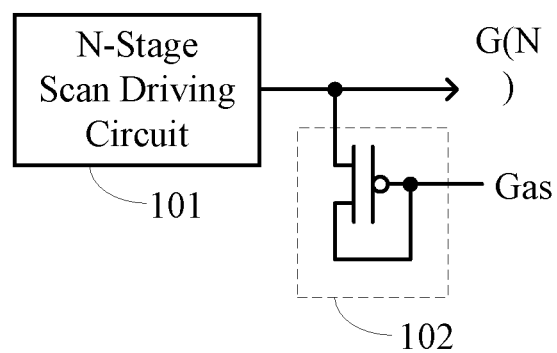
FIG. 2 illustrates the schematic circuit of the GOA unit in the GOA circuit according to the first embodiment of the present disclosure.

Refer to FIG. 2. In a specific embodiment, the switch circuit 102 comprises a first thin film transistor T1, having a source connected to the N-stage scan line G(N) and a drain connected to a gate and input with a turn-on signal Gas. Before the liquid crystal display device displays an image, the turn-on signal Gas is a low voltage level signal such that the N-stage scan line G(N) is input with the low voltage level signal. In this embodiment, the TFT in each pixel is P type.

It may be appreciated that the first thin film transistor T1 is P type. When the turn-on signal Gas is at the low voltage level, the first thin film transistor T1 turns on such that the turn-on signal Gas at the drain is delivered to the source, i.e. the N-stage scan line G(N) is at the low voltage level. Then the horizontal scan line at said stage is turned on and input with the low voltage level signal. Similarly, at All Gate On stage, through controlling the turn-on signal Gas, all the horizontal scan liens corresponding to all of the GOA units are turned on and input with the low voltage level signals. At this time a black voltage is imposed on the data line such that the remaining voltage in the pixel capacitor is removed, thereby achieving All Gate On function.

In another embodiment, if the first transistor T1 is N type, then the drain is connected to the N-stage scan line G(N), and the source is input with a low voltage level signal. When at All Gate On stage, a high voltage level is imposed to the gate of the first transistor T1, and then the N-stage scan line G(N) is input with a low voltage level signal. Similarly, the P type or N type transistors in the following embodiments may be substituted. The description is not repeated again.

Distinguishing from the prior art, a switch circuit is configured on the N-stage scan line G(N) of the GOA unit of each stage in the GOA circuit in the embodiment, for inputting a turn-on signal to the N-stage scan line G(N) of the GOA unit of each stage to turn on the TFT of each pixel before the display panel displays an image, i.e. waken from the black screen or the signal stops. And the low voltage level signal is input to each pixel to remove the remaining capacitance in the pixel capacitor to achieve All Gate On function. It may facilitate to prevent the electricity leakage when the display device is wakened from the black screen, and may also increase the stability of the circuit.

Figure 3:
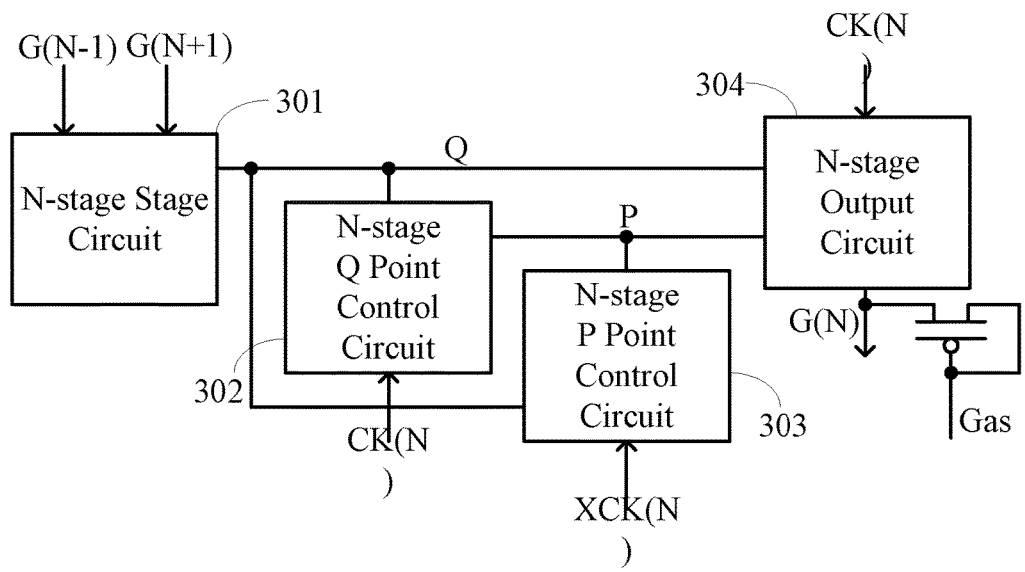
FIG. 3 illustrates the schematic circuit of the GOA circuit according to the second embodiment of the present disclosure.

Refer to FIG. 3, Illustrating the schematic circuit of the GOA circuit according to the second embodiment of the present disclosure. The N-stage scan driving circuit comprises a N-stage stage circuit 301, a N-stage Q point control circuit 302, a N-stage P point circuit 303, a N-stage output circuit 304.

The N-stage stage circuit 301, the N-stage Q point control circuit 302, the N-stage P point control circuit 303, and the N-stage output circuit 304 are connect to the Q point; the N-stage Q point control circuit 302, the N-stage P point control circuit 303 and the N-stage output circuit 304 are connected to the P point.

The N-stage stage circuit 301 is used to receive the output signal G(N−2) of the (N−2)-stage GOA unit during the forward scan, or receive the output signal G(N+2) of the (N+2)-stage GOA unit during the backward scan such that the N-stage scan driving circuit starts to drive the N-stage scan line G(N) for scanning.

The N-stage P point control circuit 303 is used to enable the output circuit 304 to output a high voltage level scan signal during scanning period.

The N-stage Q point control circuit 302 is used to enable the output circuit 304 to output a stage signal during non-scanning period.

Figure 4:
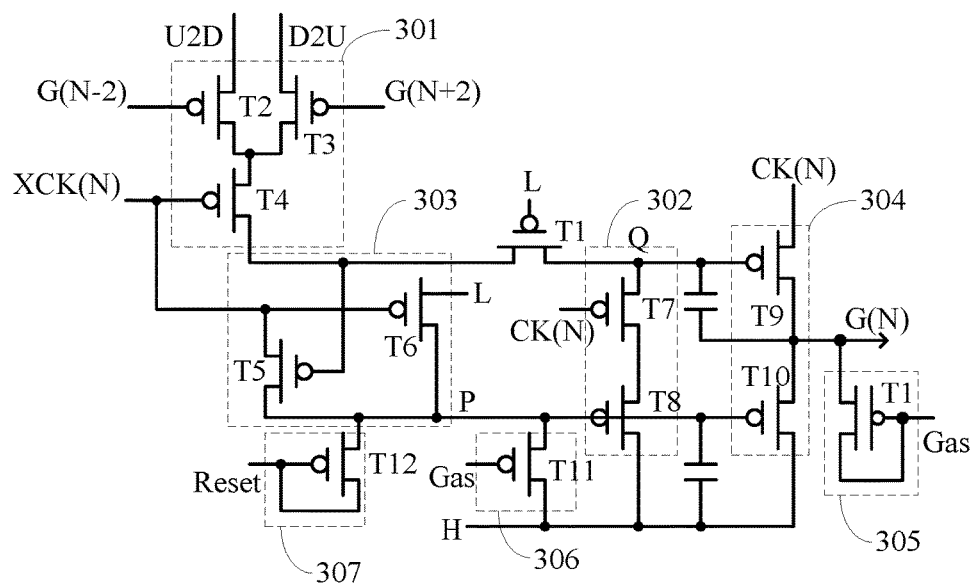
FIG. 4 illustrates the circuit of the GOA circuit according to the second embodiment of the present disclosure.

Refer to FIG. 4 illustrating the circuit of the GOA circuit according to the second embodiment of the present disclosure. In a specific embodiment:

The N-stage stage circuit 301 comprises a second thin film transistor T2, a third thin film transistor T3 and a forth thin film transistor T4. The gate of the second thin film transistor T2 is input with the output signal G(N−2) of the (N−2)-stage GOA unit, and the drain is input with a forward scan signal U2D. The gate of the third thin film transistor T3 is input with the output signal G(N+2) of the (N+2)-stage GOA unit, and the drain is input with a backward scan signal D2U. The gate of the forth thin film transistor T4 is input with a first clock signal XCK(N), the drain is connected to the source of the second thin film transistor T2 and the third thin film transistor T3, and the source is connected to the Q point.

Furthermore, in the other embodiment, the N-stage stage circuit 301 may also receive the (N−1)-stage stage signal during the forward scan, or receive the (N+1)-stage stage signal during the backward scan.

The N-stage P point control circuit 303 comprises a fifth thin film transistor T5 and a sixth thin film transistor T6. The gate of the fifth thin film transistor T5 is connected to the Q point, the drain is connected to a first clock signal XCK(N), and the source is connected to the P point. The gate of the sixth thin film transistor T6 is input with the first clock signal XCK(N), the drain is input with a low voltage level signal, and the source is connected to the P point.

The N-stage Q point control circuit 302 comprises a seventh thin film transistor T7 and a eighth thin film transistor T8. The gate of the seventh thin film transistor T7 is input with the second clock signal CK(N), the drain is connected to the Q-point. The gate of the eighth thin film transistor T8 is connected to the P point, the drain is connected to the source of the seventh thin film transistor T7, and the source is input with a high voltage level signal.

The N-stage output circuit 304 comprises a ninth thin film transistor T9 and a tenth thin film transistor T10. The gate of the ninth thin film transistor T9 is connected to the Q point, the drain is input with a second clock signal CK(N), and the source is connected to the N-stage scan line G(N). The gate of the tenth thin film transistor T10 is connected to the P point, the drain is connected to the N-stage scan line G(N), and the source is input with a high voltage level signal.

The N-stage switch circuit 305 is the same as the switch circuits of the above embodiments. The description is not repeated herein.

In other embodiment, the N-stage scan driving circuit may further comprise:

a P point pull-up circuit 306; wherein the P point pull-up circuit 306 comprises an eleventh thin film transistor T11, having a gate input with a turn-on signal Gas, a drain connected to the P point and a source input with a high voltage level signal;

a resent circuit 307; wherein the reset circuit 307 comprises a twelfth thin film transistor T12, having a gate and a source input with a reset signal Reset, and a drain connected to the P point.

In FIG. 4, H indicates the high voltage level signal and L indicates the low voltage level signal.

Figure 5:
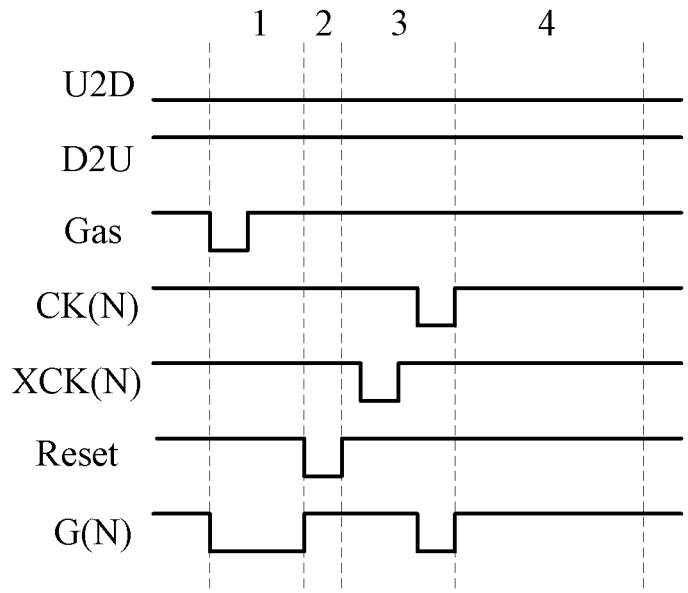
FIG. 5 is the timing chart of the GOA circuit according to the second embodiment of the present disclosure.

Refer to FIG. 5 is the timing chart of the GOA circuit according to the second embodiment of the present disclosure. The following description takes the forward scan as the example to specifically explain the implementation of the circuit.

During the forward scanning period, U2D is at low voltage level, and D2U is at high voltage level such that when the (N−2)-stage scan line G(N−2) and the first clock signal XCK(N) is at the low voltage level, the Q point is input with U2D signal, i.e. the low voltage level signal. In another embodiment, for example, during the backward scanning period, U2D is at high voltage level, and D2U is at low voltage level such that when the (N+2)-stage scan line G(N+2) and the first clock signal XCK(N) is at the low voltage level, the Q point is input with D2U signal, i.e. the low voltage level signal.

In the first action region, that is All Gate On action period, at the initial stage, Gas signal is at the low voltage level. The first thin film transistor T1 turns on. The N-stage scan line G(N) is input with a low voltage level signal such that the TFT in each pixel turns on. In this period, the signal line of the pixel is input with a touch signal such that the display screen may be waken from the black screen at any time. After the display screen is waken, the signal line of the pixel is input with low voltage level (that is black voltage) to discharge the pixel point to remove the remaining capacitance of the pixel point. Specifically, during All Gate on action period, because Gas signal is directly input to the N-stage scan line G(N), then no matter how the N-stage scan line driving circuit works, the N-stage scan line G(N) outputs a low voltage level signal.

In the second action region, that is the restoration action period, the restoring signal Reset is at low voltage level. The twelfth thin film transistor T12 turns on such that P point is at the low voltage level. The seventh thin film transistor T7 turns on. Because the seventh thin film transistor T7 turns on, the N-stage scan line G(N) directly connects to a high voltage level signal such that the voltage level of the N-stage scan line G(N) is pulled up. The restoration of the output signal of the N-stage scan line G(N) is thus achieved. Specifically, during the restoration period, because the N-stage scan line G(N) directly is inputted with a high voltage level signal, then no matter how the N-stage scan line driving circuit works, the N-stage scan line G(N) outputs a low voltage level signal.

In the third action region, that is the normal display region, the progressive scan is performed according to the stage signal G(N−2), the first clock signal XCK(N) and the second clock signal CK(N). During the scan period of the N-stage GOA unit, the N-stage scan line G(N) outputs a signal having the same voltage level as the second clock signal CK(N).

Specifically, when the stage signal G(N−2) is at the low voltage level, and the first clock signal XCK(N) is at the low voltage level, the forth thin film transistor T4 turn on, Q point is at the low voltage level such that the N-stage scan line G(N) outputs a signal having the same voltage level as that of the second clock signal CK(N), that is a high voltage level signal. Simultaneously, as P point at the low voltage level, the tenth thin film transistor T10 turns on The high voltage level signal is input to the N-stage scan line G(N). Thus the stable output of the N-stage scan line G(N) is ensured.

When the first clock signal XCK(N) is at the high voltage level, the forth thin film transistor T4, and the sixth thin film transistor T6 turn off. Q point is maintained at the low voltage level m and thus the fifth thin film transistor T5 turns on. Therefore, P point becomes to be at the high voltage level under the action of the first clock signal XCK(N). Therefore, the second clock signal CK(N) is directly input to the N-stage scan line G(N) such that the N-stage scan line G(N) outputs a signal having a voltage level the same as that of the second clock single CK(N). In the forth action region, that is the signal stopping region, when the display image stops or a touch on the display screen such that the display image stops, all the voltage levels of the terminals and the points are maintained at the high voltage level such that the display image is kept unchanged.

It should be noted that the first clock signal XCK(N) and the second clock signal CK(N) at the adjacent two GOA unit stages are different. In one embodiment, the first clock signal at the N−1 stage is XCK, the second clock signal is CK; the first clock signal at the N stage is CK, and the second clock signal is XCK; the first clock signal at the N+1 stage is XCK, and the second clock signal is CK. The voltage level of XCK and CK may be shown as FIG. 5, and so on.

Distinguishing from the prior art, a switch circuit is configured on the N-stage scan line G(N) of the GOA unit of each stage in the GOA circuit in the embodiment, for inputting a turn-on signal to the N-stage scan line G(N) of the GOA unit of each stage to turn on the TFT of each pixel before the display panel displays an image, i.e. waken from the black screen or the signal stops. And the low voltage level signal is input to each pixel to remove the remaining capacitance in the pixel capacitor to achieve All Gate On function. It may facilitate to prevent the electricity leakage when the display device is wakened from the black screen, and may also increase the stability of the circuit. On the hand, the GOA unit of this embodiment is configured additionally with a P point pull up circuit and a restoration circuit to reduce the risk of the electricity leakage at Q point during the period of signal stopping and increase the stability of the circuit.

Figure 6:
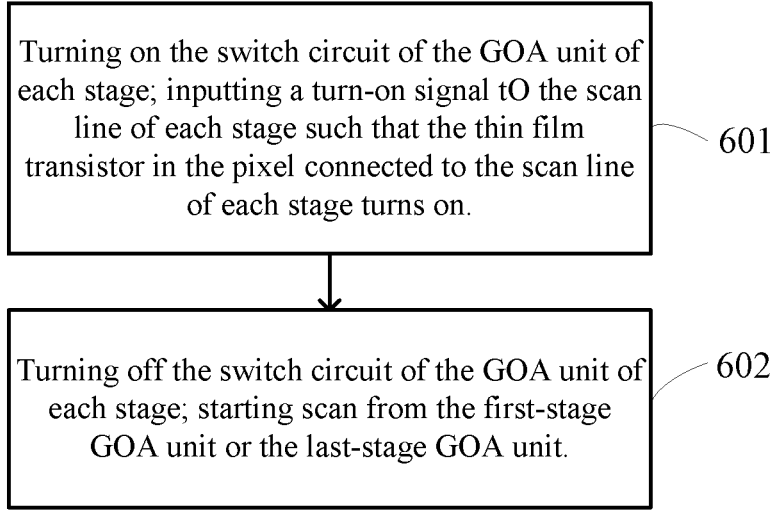
FIG. 6 illustrates the flow chart of the method for driving the GOA circuit according to one embodiment of the present disclosure.

FIG. 6 illustrates the flow chart of the method for driving the GOA circuit according to one embodiment of the present disclosure. The method includes:

Step 601: turning on the switch circuit of the GOA unit of each stage; inputting a turn-on signal to the scan line of each stage such that the thin film transistor in the pixel connected to the scan line of each stage turns on; and Step 602: turning off the switch circuit of the GOA unit of each stage; starting scan from the first-stage GOA unit or the last-stage GOA unit.

This embodiment is a driving method based on the GOA circuit as mentioned above. The implementation may refer to the embodiments as above and the explanation thereof is not repeated again herein.

Figure 7:
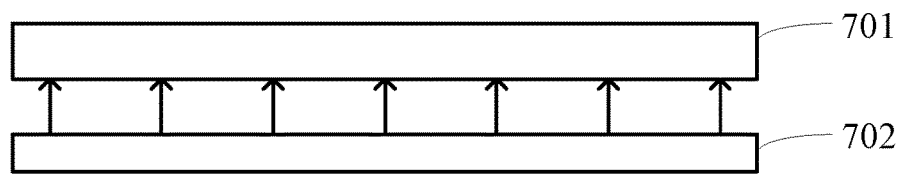
FIG. 7 illustrates the schematic structure of the liquid crystal display device according to one embodiment of the present disclosure.

FIG. 7 illustrates the schematic structure of the liquid crystal display device according to one embodiment of the present disclosure. The liquid crystal display device comprises a display panel 701 and a backlight 702. The display panel 701 includes GOA circuits, which are the GOA circuits as mentioned in the above embodiments. The specific embodiment is similar and the explanation thereof is not repeated again herein.

The above disclosures only are the preferred embodiments of the disclosure it can not be used to limit the scope of the disclosure as claimed, Therefore, the equivalent changes is made according to the disclosure as claimed, the scope of the disclosure is still covered.

What is claimed is:

1. A gate on array (GOA) circuit for a liquid crystal display device, comprising:
    a plurality of $N^{th}$-stage GOA units connected in cascade, wherein N is an positive integer and the $N^{th}$-stage GOA unit comprises an $N^{th}$-stage circuit, an $N^{th}$-stage Q point control circuit, an $N^{th}$-stage P point circuit, an $N^{th}$-stage output circuit and a switch circuit;
    wherein the $N^{th}$-stage stage circuit, the $N^{th}$-stage Q point control circuit, the $N^{th}$-stage P point control circuit, and the $N^{th}$-stage output circuit are connected to a Q point; the $N^{th}$-stage Q point control circuit, the $N^{th}$-stage P point control circuit and the $N^{th}$-stage output circuit are connected to a P point; the $N^{th}$-stage output circuit is further connected to an $N^{th}$-stage scan line; and
    wherein the switch circuit is connected to the $N^{th}$-stage scan line for sending a turn-on signal to the $N^{th}$-stage scan line before the liquid crystal display device displays an image such that at least one thin-film transistor in a pixel connected to the $N^{th}$-stage scan line turns on.

2. The gate on array (GOA) circuit according to claim 1, wherein the switch circuit comprises a first thin film transistor having a source connected to the $N^{th}$-stage scan line and a drain connected to a gate and input with a turn-on signal; before the liquid crystal display device displays the image, the turn-on signal is a low voltage level signal such that the low voltage level signal is input to the $N^{th}$-stage scan line, thereby turning on the thin film transistor in the pixel connected to the $N^{th}$-stage scan line.

3. The gate on array (GOA) circuit according to claim 1, wherein the $N^{th}$-stage stage circuit comprises a second thin film transistor, a third thin film transistor and a forth thin film transistor;
    wherein the gate of the second thin film transistor is input with an output signal of the $(N-2)^{th}$-stage GOA unit, and the drain of the second thin film transistor is input with a forward scan signal;
    wherein the gate of the third thin film transistor is input with the output signal of the (N+2)-stage GOA unit, and the drain of the third thin film transistor is input with a backward scan signal; and
    wherein the gate of the forth thin film transistor is input with a first clock signal, the drain of the forth thin film transistor is connected to the sources of the second thin film transistor and the third thin film transistor, and the sources are connected to a Q point.

4. The gate on array (GOA) circuit according to claim 1, wherein the $N^{th}$-stage P point control circuit comprises a fifth thin film transistor and a sixth thin film transistor;
    wherein the gate of the fifth thin film transistor is connected to the Q point, the drain of the fifth thin film transistor is connected to a first clock signal, and the source the fifth thin film transistor is connected to the P point; and
    wherein the gate of the sixth thin film transistor is input with the first clock signal, the drain of the sixth thin film transistor is input with a low voltage level signal, and the source of the sixth thin film transistor is connected to the P point.

5. The gate on array (GOA) circuit according to claim 1, wherein the $N^{th}$-stage Q point control circuit comprises a seventh thin film transistor and a eighth thin film transistor;
    wherein the gate of the seventh thin film transistor is input with a second clock signal, and the drain of the seventh thin film transistor is connected to the Q-point; and
    wherein the gate of the eighth thin film transistor is connected to the P point, the drain of the eighth thin film transistor is connected to the source of the seventh thin film transistor, and the source of the eighth thin film transistor is input with a high voltage level signal.

6. The gate on array (GOA) circuit according to claim 1, wherein the $N^{th}$-stage output circuit comprises a ninth thin film transistor and a tenth thin film transistor;
    wherein the gate of the ninth thin film transistor is connected to the Q point, the drain of the ninth thin film transistor is input with a second clock signal, and the source of the ninth thin film transistor is connected to the $N^{th}$-stage scan line; and
    wherein the gate of the tenth thin film transistor is connected to the P point, the drain of the tenth thin film transistor is connected to the $N^{th}$-stage scan line, and the source of the tenth thin film transistor is input with a high voltage level signal.

7. The gate on array (GOA) circuit according to claim 1, wherein the $N^{th}$-stage scan driving circuit further comprises a P point pull-up circuit; and
    wherein the P point pull-up circuit comprises an eleventh thin film transistor having a gate input with a turn-on signal, a drain connected to the P point and a source input with a high voltage level signal.

8. The gate on array (GOA) circuit according to claim 1, wherein the $N^{th}$-stage scan driving circuit further comprises a resent circuit;
    wherein the reset circuit comprises a twelfth thin film transistor having a gate and a source input with a reset signal, and a drain connected to the P point.

9. A method for driving a gate on array (GOA) circuit comprising a plurality of $N^{th}$-stage GOA units connected in cascade, wherein N is an positive integer and the $N^{th}$-stage GOA unit comprises a switch circuit connected to an $N^{th}$-stage-scan line, the method comprises:
    turning on the switch circuit of the GOA unit of each stage of the plurality of $N^{th}$-stage GOA units; inputting a turn-on signal to the scan line of each stage such that a thin film transistor in a pixel connected to the scan line of each stage turns on; and
    turning off the switch circuit of the GOA unit of each stage; starting scan from the first-stage GOA unit or the last-stage GOA unit.

10. A liquid crystal display device comprising:
    a display panel and a backlight;
    wherein the display panel comprising a GOA circuit comprising a plurality of $N^{th}$-stage GOA units connected in cascade, wherein N is an positive integer and the $N^{th}$-stage GOA unit comprises an $N^{th}$-stage stage circuit, an $N^{th}$-stage Q point control circuit, an $N^{th}$-stage P point circuit, an $N^{th}$-stage output circuit and a switch circuit;

wherein the $N^{th}$-stage stage circuit, the $N^{th}$-stage Q point control circuit, the $N^{th}$-stage P point control circuit, and the $N^{th}$ stage output circuit are connected to a Q point; the $N^{th}$-stage Q point control circuit, the $N^{th}$ stage P point control circuit and the $N^{th}$ stage output circuit are connected to a P point, the $N^{th}$-stage output circuit is further connected to an $N^{th}$-stagescan line; and wherein the switch circuit is connected to the $N^{th}$-stage scan line for sending a turn-on signal to the $N^{th}$-stage scan line before the liquid crystal display device displays an image such that at least one thin-film transistor in a pixel connected to the $N^{th}$-stage scan line turns on.

11. The liquid crystal display device according to claim 10, wherein the switch circuit comprises a first thin film transistor having a source connected to the $N^{th}$-stage scan line and a drain connected to a gate and input with a turn-on signal; before the liquid crystal display device displays the image, the turn-on signal is a low voltage level signal such that the low voltage level signal is input to the $N^{th}$-stage scan line, thereby turning on the thin film transistor in the pixel connected to the $N^{th}$-stage scan line.

12. The liquid crystal display device according to claim 10, wherein the $N^{th}$-stage stage circuit comprises a second thin film transistor, a third thin film transistor and a forth thin film transistor;

wherein the gate of the second thin film transistor is input with an output signal of the $(N-2)^{th}$-stage GOA unit, and the drain of the second thin film transistor is input with a forward scan signal;

wherein the gate of the third thin film transistor is input with the output signal of the $(N+2)^{th}$-stage GOA unit, and the drain of the third thin film transistor is input with a backward scan signal; and wherein the gate of the forth thin film transistor is input with a first clock signal, the drain of the forth thin film transistor is connected to the sources of the second thin film transistor and the third thin film transistor, and the sources are connected to a Q point.

13. The liquid crystal display device according to claim 10, wherein the $N^{th}$ stage P point control circuit comprises a fifth thin film transistor and a sixth thin film transistor;

wherein the gate of the fifth thin film transistor is connected to the Q point, the drain of the fifth thin film transistor is connected to a first clock signal, and the source the fifth thin film transistor is connected to the P point; and wherein the gate of the sixth thin film transistor is input with the first clock signal, the drain of the sixth thin film transistor is input with a low voltage level signal, and the source of the sixth thin film transistor is connected to the P point.

14. The liquid crystal display device according to claim 10, wherein the $N^{th}$ stage Q point control circuit comprises a seventh thin film transistor and a eighth thin film transistor;

wherein the gate of the seventh thin film transistor is input with a second clock signal, and the drain of the seventh thin film transistor is connected to the Q-point; and wherein the gate of the eighth thin film transistor is connected to the P point, the drain of the eighth thin film transistor is connected to the source of the seventh thin film transistor, and the source of the eighth thin film transistor is input with a high voltage level signal.

15. The liquid crystal display device according to claim 10, wherein the $N^{th}$ stage output circuit comprises a ninth thin film transistor and a tenth thin film transistor;

wherein the gate of the ninth thin film transistor is connected to the Q point, the drain of the ninth thin film transistor is input with a second clock signal, and the source of the ninth thin film transistor is connected to the $N^{th}$-stage scan line; and wherein the gate of the tenth thin film transistor is connected to the P point, the drain of the tenth thin film transistor is connected to the $N^{th}$-stage scan line, and the source of the tenth thin film transistor is input with a high voltage level signal.

16. The liquid crystal display device according to claim 10, wherein the $N^{th}$-stage scan driving circuit further comprises a P point pull-up circuit; and wherein the P point pull-up circuit comprises an eleventh thin film transistor having a gate input with a turn-on signal, a drain connected to the P point and a source input with a high voltage level signal.

17. The liquid crystal display device according to claim 10, wherein the $N^{th}$-stage scan driving circuit further comprises a resent circuit;

wherein the reset circuit comprises a twelfth thin film transistor having a gate and a source input with a reset signal, and a drain connected to the P point.

* * * * *